(12) United States Patent
Chigullapalli et al.

(10) Patent No.: US 12,745,373 B2
(45) Date of Patent: Sep. 22, 2026

(54) COMPUTING SYSTEM WITH EXTERNAL DISCONNECTS

(71) Applicant: AMD Design, LLC, Wilmington, DE (US)

(72) Inventors: Sruti Chigullapalli, Seattle, WA (US); Paul Anderson, Leander, TX (US); Frank Russo, Weehawken, NJ (US)

(73) Assignee: AMD DESIGN, LLC, Wilmington, DE (US)

( * ) Notice: Subject to any disclaimer, the term of this patent is extended or adjusted under 35 U.S.C. 154(b) by 255 days.

(21) Appl. No.: 18/586,748

(22) Filed: Feb. 26, 2024

(65) Prior Publication Data

US 2025/0275100 A1 Aug. 28, 2025

(51) Int. Cl.
*H05K 7/20* (2006.01)

(52) U.S. Cl.
CPC ..... *H05K 7/20781* (2013.01); *H05K 7/20272* (2013.01); *H05K 7/20772* (2013.01)

(58) Field of Classification Search
CPC ........... H05K 7/20272; H05K 7/20772–20781
See application file for complete search history.

(56) References Cited

U.S. PATENT DOCUMENTS

| | | | | |
|---|---|---|---|---|
| 7,515,418 | B2 * | 4/2009 | Straznicky | H05K 7/1461 361/699 |
| 10,609,839 | B1 * | 3/2020 | Archer | H05K 7/20236 |
| 11,157,050 | B1 * | 10/2021 | Lunsman | H05K 7/20509 |
| 12,309,958 | B2 * | 5/2025 | Magnoux | H05K 7/1491 |
| 12,382,611 | B2 * | 8/2025 | Chen | H05K 7/20772 |
| 12,408,306 | B2 * | 9/2025 | Tsai | H05K 7/20254 |
| 2025/0248005 | A1 * | 7/2025 | Sy | H05K 7/20781 |

FOREIGN PATENT DOCUMENTS

| | | | | |
|---|---|---|---|---|
| CN | 111295087 A | * | 6/2020 | H05K 7/20736 |

* cited by examiner

*Primary Examiner* — Robert J Hoffberg
(74) *Attorney, Agent, or Firm* — SCULLY, SCOTT, MURPHY & PRESSER, P.C.

(57) ABSTRACT

A computing device includes a plurality of rear inlet disconnects extend from the rear side of the housing. The rear inlet disconnects are operable to be fluidly coupled with a rack manifold and receive fluid from the rack manifold. The rear inlet disconnects include a rear-to-front disconnect and a rear-to-cooling disconnect. A front inlet manifold is coupled with the housing and includes at least one front inlet disconnect operable to be fluidly coupled with one or more inlet cooling disconnects extending from the front side of the housing. The inlet cooling disconnects are operable to be fluidly connected with the liquid cooling system. An inlet transmission tube is coupled with an outside surface of the housing. The inlet transmission tube in fluid communication with the rear-to-front disconnect and operable to direct the fluid from the rear-to-front disconnect to the front inlet manifold.

20 Claims, 5 Drawing Sheets

COMPUTING SYSTEM WITH EXTERNAL DISCONNECTS

FIELD

The present disclosure relates generally to a computing system with a liquid cooling system that includes external disconnects (e.g., no internal disconnects).

BACKGROUND

Computing systems such as modular servers and/or information handling systems are continually improving and becoming more powerful. The chips, for example artificial intelligence chips, are becoming more powerful, which leads to increased thermal design power. To manage the heat generated by the chips, liquid cooling is becoming a main strain on the hyperscale server industry. For example, liquid heat capture rate of greater than 90% is a goal.

BRIEF DESCRIPTION OF THE DRAWINGS

Implementations of the present technology will now be described, by way of example only, with reference to the attached figures, wherein.

DETAILED DESCRIPTION

Figure 1:
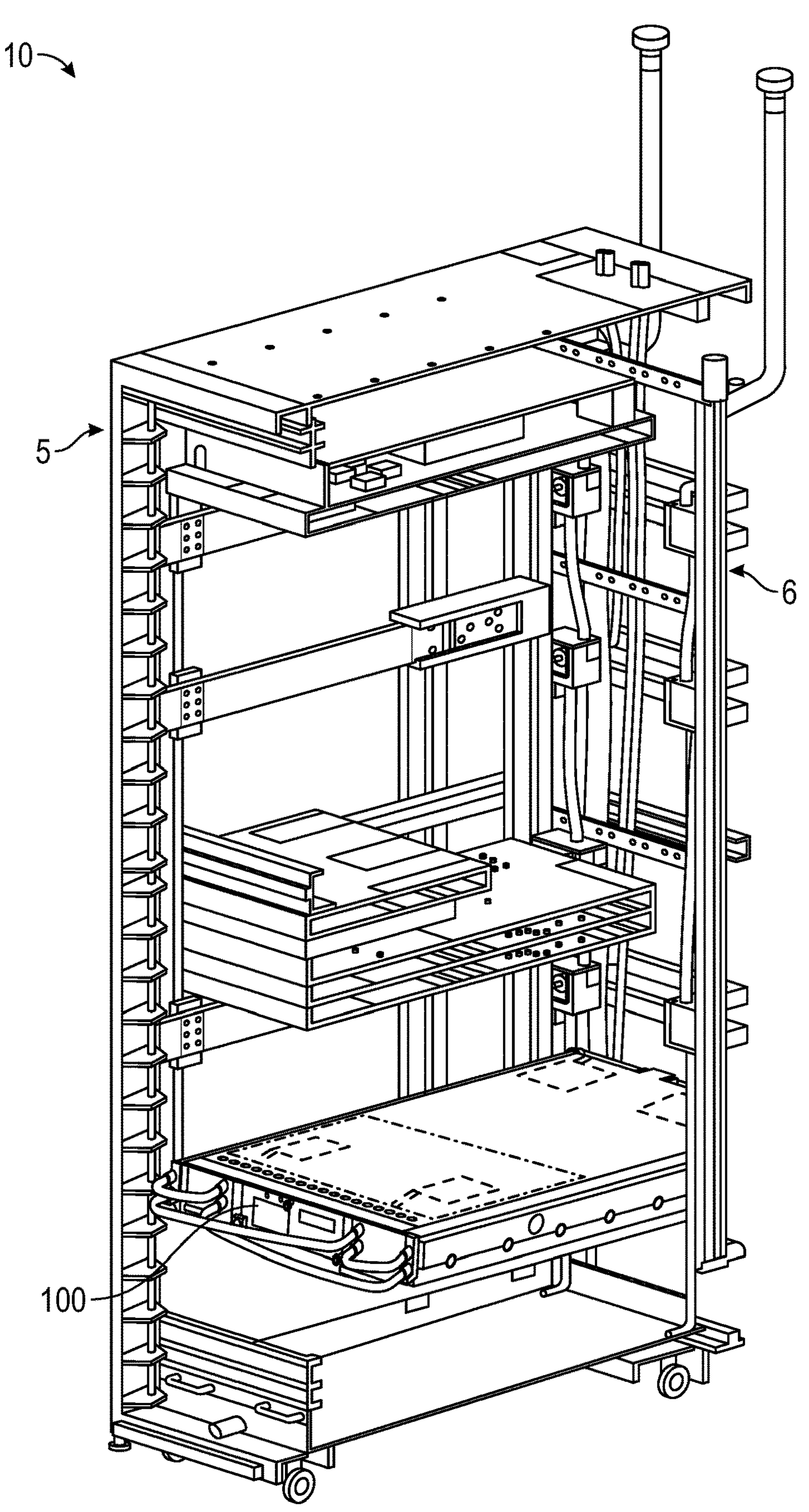
FIG. 1 illustrates a computing system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Liquid cooled computing devices are becoming the norm, for example for artificial intelligence and/or high performance computing space. Large computing components such as processing units (e.g., central processing units (CPUs), tensor processing units (TPUs), graphics processing units (GPUs), and/or computational architectures of any other suitable type) being liquid cooled can provide a 70% heat capture rate. To achieve greater than 90% heat capture rate, multiple computing components need to be liquid cooled. For conventional computing systems, this can come at the cost of serviceability (e.g., number of disconnects and their locations) and/or a greater number of leak points.

Processing units are positioned adjacent or closer to the rear side of the computing device while peripheral component interconnect express (PCIE) cards are positioned adjacent or closer to the front side of the computing device. Accordingly, higher heat capture rate requires cooling of the processing units as well as the PCIE cards.

The presently disclosed computing device provides two sets of disconnects (e.g., blind mate quick disconnects) in the rear side of the computing device out of which one set of the disconnects supplies fluid to the front PCIE cards. All liquid connections for the computing device occur outside of the housing of the computing device thereby eliminating all internal disconnects and possible leak points inside the computing device.

In at least one example, liquid drip bibs can be provided to catch any stray drops that occur during disconnect. For example, drip bibs can be coupled with manifolds of the computing device. Accordingly, the drip bibs can be operable to catch any fluid that leaks from the disconnects of the manifolds. In some examples, an absorbent sponge can be included in a tray of the drip bib(s) to eliminate any chance of fluid spillage from the drip bib(s).

The disclosure now turns to FIG. 1, which illustrates an example of a computing system 10 to be used, for example, with a liquid cooled modular server and/or information handling system. The computing system 10 includes a rack 5 with a rack manifold 6. The rack 5 is operable to receive one or more computing devices 100. The computing devices 100 can be fluidly coupled with the rack manifold 6 such that fluid is operable to flow between the rack manifold 6 and the computing device 100, for example through a liquid cooling system for the computing device 100.

Figure 2A:
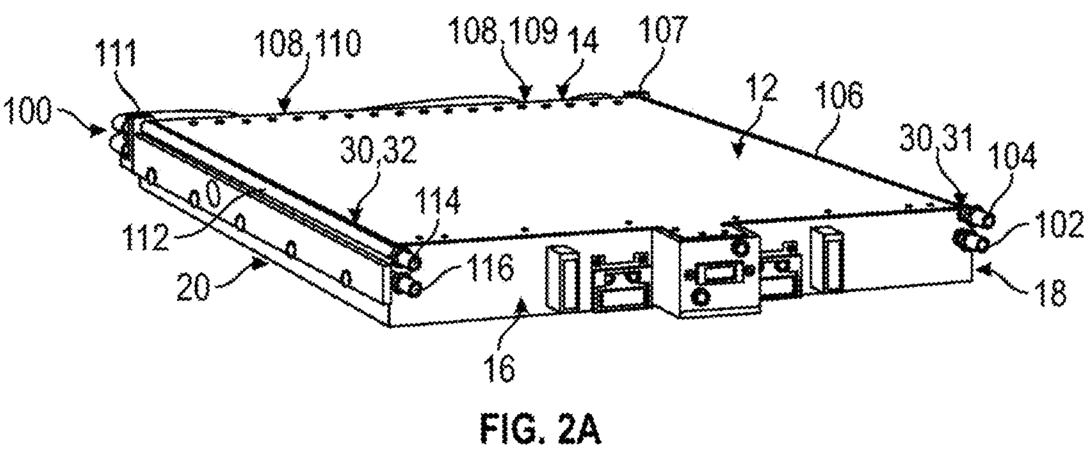
FIG. 2A illustrates a rear view of a computing device.
Figure 2B:
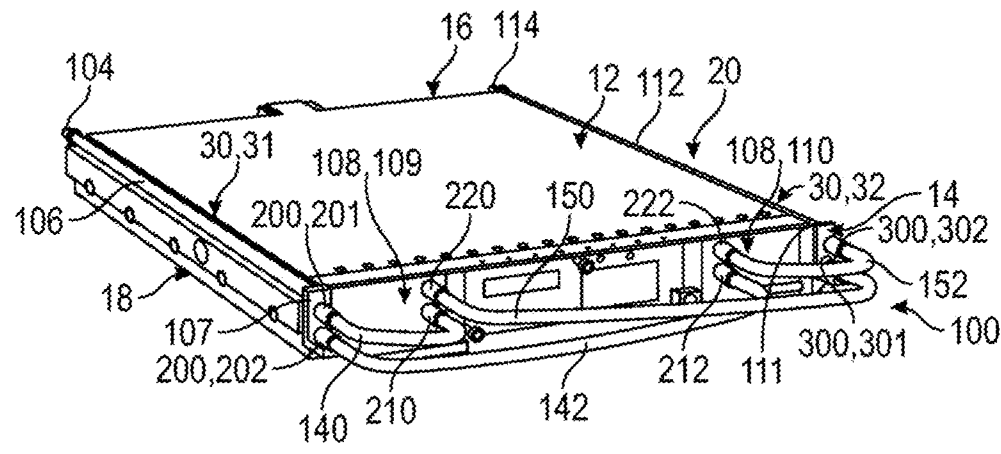
FIG. 2B illustrates a front view of the computing device.
Figure 2C:
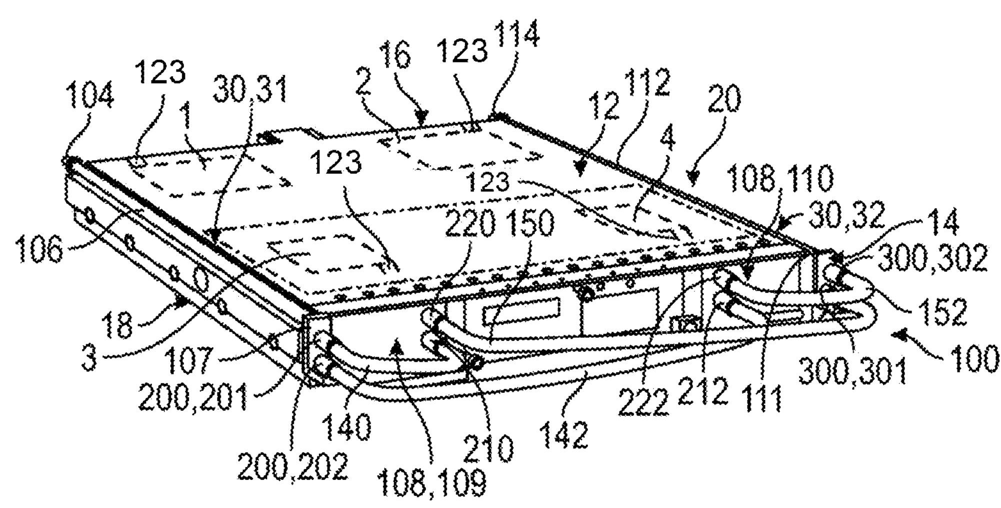
FIG. 2C illustrates a front view of the computing device, showing the computing components of the computing device.

FIG. 2A illustrates a rear view of the computing device 100, and FIGS. 2B and 2C illustrates a front view of the computing device 100. The computing device 100 can include a housing 12 that is operable to receive a plurality of computing components including a liquid cooling system 123 operable to lower the temperature of the computing components. The housing 12 includes a front side 14, a rear side 16 opposite the front side 14, a left side 18 and a right side 20. The left side 18 and the right side 20 can span between the front side 14 and the rear side 16. When the computing device 100 is received in the rack 5, the rear side 16 of the housing 12 can be positioned adjacent to the rack manifold 6.

As shown in FIG. 2C, the computing device 100 can include a plurality of computing components 1, 2, 3, 4 received in the housing 12. For example, the computing components can include one or more processing units 1, 2 (e.g., CPU, TPU, GPU, and/or any other suitable computational architecture) and one or more peripheral component interconnect express (PCIE) cards 3, 4. At least one of the computing components, for example the processing unit 1 and/or the processing unit 2, can be positioned in the housing 12 adjacent to the rear side 16 of the housing 12. At least one of the computing components 3, 4, for example the PCIE cards, rulers, hard drives, etc., can be positioned in the housing 12 adjacent to the front side 14 of the housing 12. In some examples, the computing components 3, 4 (e.g., the PCIE cards, rulers, hard drives, etc.) positioned adjacent to the front side 14 of the housing 12 be received in one or more modules 108, for example a left module 109 and a right module 110. The left module 109 can be adjacent to the left side 18 of the housing 12, and the right module 110 can be adjacent to the right side 20 of the housing 12. Left module 109 and the right module 110 can include separate connections to the liquid cooling system 123.

Thermal management of the computing systems 10 and the computing device 100 can be critical to the performance and time between failures for the computing system 10. As computing devices 100 in computing systems 10 such as modular servers and/or information handling systems can have higher temperature environments, air cooling can be insufficient to adequately cool down the computing systems 10. However, liquid cooling systems can bring about a cost of serviceability and leak point. High heat capture (e.g., heat capture rate of greater than 90%) can include cooling of the computing components 1, 2 (e.g., processing units 1, 2) which are positioned adjacent to the rear side 16 of the housing 12 as well as the computing components 3, 4 (e.g., PCIE cards, rulers, hard drives, etc.) positioned adjacent to the front side 14 of the housing 12. Increasing the number of computing components 1, 2, 3, 4 that need liquid cooling can increase the leak points which can damage the computing device 100. Accordingly, to prevent leaking in the computing device 100, the computing device 100 as disclosed herein does not use any internal quick disconnects (e.g., disconnects for liquid cooling fluid disposed inside the housing 12). All of the disconnects are disposed outside of the housing 12 so that if there are any leaks, the computing components 1, 2, 3, 4 are not damaged. Additionally, as the left module 109 and the right module 110 are installed adjacent to the front side 14 of the computing device 100, liquid cooling for the left module 109 and the right module 110 are connected at the front interface of the computing device 100, which leads to improved ease of serviceability.

As illustrated in FIG. 2A, the computing device 100 includes a plurality of rear inlet disconnects 102, 104 extending from the rear side 16 of the housing 12. The rear inlet disconnects 102, 104 are operable to be fluidly coupled with the rack manifold 6 and receive the fluid from the rack manifold 6. The rear inlet disconnects 102, 104 can include a rear-to-front disconnect 104 and a rear-to-cooling disconnect 102. The rear-to-front disconnect 104 can be operable to direct the fluid from the rack manifold 6 towards the front side 14 of the housing 12. The rear-to-cooling disconnect 102 can be operable to be fluidly coupled with the liquid cooling system 123 to lower the temperature of the computing components 1, 2 (e.g., the processing units 1, 2) positioned adjacent to the rear side 16 of the housing 12.

The computing device 100 can also include a plurality of rear outlet disconnects 114, 116 extending from the rear side 16 of the housing 12. The rear outlet disconnects 114, 116 can be operable to be fluidly coupled with the rack manifold 6 and provide the fluid from the liquid cooling system 123 of the computing device 100 back to the rack manifold 6. The rear outlet disconnects 114, 116 can include a front-to-rear disconnect 114 and a cooling-to-rear disconnect 116. The front-to-rear disconnect 114 can be operable to receive fluid from the front side 14 of the housing 12 and provide the fluid to the rack manifold 6. The cooling-to-rear disconnect 116 can be operable to receive the fluid from the liquid cooling system 123 after the fluid lowers the temperature of the computing components 1, 2 (e.g., the processing units 1, 2) positioned adjacent to the rear side 16 of the housing 12.

For example, the fluid can flow from the rack manifold 6 into the liquid cooling system 123 for the computing device 100 via the rear-to-cooling disconnect 102. The fluid flows in the liquid cooling system 123 to the computing components 1, 2 adjacent to the rear side 16 of the housing 12 and lowers the temperature of the computing components 1, 2. The fluid then flows out of the liquid cooling system 123 of the computing device 100 through the cooling-to-rear disconnect 116 and into the rack manifold 6.

In at least one example, the rear inlet disconnects 102, 104 and/or the rear outlet disconnects 114, 116 can include quick disconnects. The rear inlet disconnects 102, 104 and/or the rear outlet disconnects 114, 116 can be operable to automatically close upon disconnection of the rear inlet disconnects 102, 104 and/or the rear outlet disconnects 114, 116 with the rack manifold 6. For example, the rear inlet disconnects 102, 104 and/or the rear outlet disconnects 114, 116 can include valves such that when the rear inlet disconnects 102, 104 and/or the rear outlet disconnects 114, 116 are disconnected from the rack manifold 6, the corresponding valve(s) automatically close to prevent fluid from leaking in the computing system 10. Accordingly, the computing device 100 can be disconnected from the rack manifold 6 such that the computing device 100 can be serviced with reduced amounts of fluid and/or no leaking fluid which can damage the computing system 10.

As the rear inlet disconnects 102, 104 and the rear outlet disconnects 114, 116 are positioned external to the housing 12, no fluid connection is being made within the housing 12. Accordingly, any possible leaks would not lead to fluid leaking into the housing 12 and impacting the computing components 1, 2, 3, 4. Additionally, serviceability of the computing device 100 is improved since the computing device 100 can be disconnected easily with external connections 102, 104, 114, 116.

The computing device 100 includes a front inlet manifold 107 coupled with the housing 12. The front inlet manifold 107 can be coupled with the front side 14 of the housing 12, as illustrated in FIGS. 2A and 2B. The front inlet manifold 107 is operable to be fluidly connected with the rear-to-front disconnect 104 such that the fluid from the rack manifold 6 can flow from the rear-to-front disconnect 104 to the front inlet manifold 107.

For example, as illustrated in FIGS. 2A-2C, an inlet transmission tube 106 can be in fluid communication with the rear-to-front disconnect 104 and the front inlet manifold 107 such that the inlet transmission tube 106 is operable to direct the fluid from the rear-to-front disconnect 104 to the front inlet manifold 107. In at least one example, the inlet transmission tube 106 can be made at least partially from copper. In some examples, the inlet transmission tube 106 can be made of any suitable material to transport the fluid between the rear-to-front disconnect 104 and the front inlet manifold 107 without deviating from the scope of the disclosure. As illustrated in FIGS. 2A-2C, the inlet transmission tube 106 can be coupled with an outside surface 30 of the housing 12. For example, the housing 12 can form an inlet groove 31 operable to receive the inlet transmission tube 106. The inlet transmission tube 106 is positioned external to the housing 12 of the computing device 100 such that the fluid remains outside of the housing 12 in case of leaks and for easy serviceability. By being received in the inlet groove 31, the footprint of the computing device 100 is not impacted or increased so that the computing device 100 can still be received in the rack 5 without needing any modification of rack 5 of the computing system 10.

With the inlet transmission tube 106 passing from the rear-to-front disconnect 104 to the front inlet manifold 107, the fluid can be directed to the front side 14 of the housing 12, so that the fluid can flow to the computing components 3, 4 positioned adjacent to the front side 14 of the housing 12—without utilizing internal fluid connections.

Figure 3:
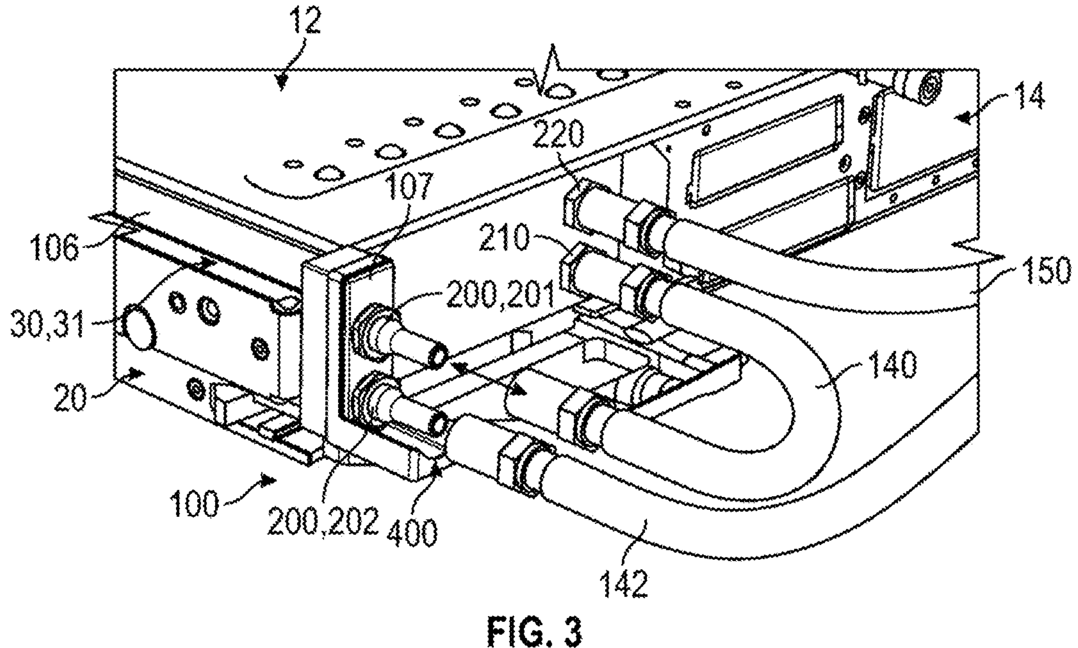
FIG. 3 illustrates a front view of the computing device, with inlet conduits coupled with front inlet disconnects and inlet cooling disconnects.

In at least one example, as illustrated in FIGS. 2B-3, the front inlet manifold 107 can include at least one front inlet disconnect 200 operable to be fluidly coupled with one or more inlet cooling disconnects 210, 212 extending from the front side 14 of the housing 12 via corresponding one or more inlet conduits 140, 142. The front inlet manifold 107 distributes the fluid received from the inlet transmission tube 106 between the at least one front inlet disconnect 200. The inlet cooling disconnects 210, 212 are operable to be fluidly connected with the liquid cooling system 123, for example to lower the temperature of the computing components 3, 4 (e.g., PCIE cards) positioned adjacent to the front side 14 of the housing 12. For example, the inlet cooling disconnects 210, 210 are operable to be fluidly connected with the liquid cooling system 123 to lower the temperature of the computing components 3 within the left module 109 and the computing components 4 within the right module 110 adjacent to the front side 14 of the housing 12.

For example, as illustrated in FIGS. 2B-3, the front inlet manifold 107 can include a left front inlet disconnect 201 that is operable to be fluidly coupled with the left inlet conduit 140 that is operable to be fluidly coupled with the left inlet cooling disconnect 210. The fluid can then enter the liquid cooling system 123 for the left module 109 through the left inlet cooling disconnect 210. In at least one example, the front inlet manifold 107 can also include a right front inlet disconnect 202 that is operable to be fluidly coupled with the right inlet conduit 142 that is operable to be fluidly coupled with the right inlet cooling disconnect 212. The fluid can then enter the liquid cooling system 123 for the right module 110 through the right inlet cooling disconnect 212. This can allow for liquid cooling for more computing components 1, 2, 3, 4, leading to higher heat capture rate.

After lowering the temperatures of the computing components 3, 4, one or more outlet cooling disconnects 220, 222 fluidly coupled with the liquid cooling system received in the housing 12 can be operable to receive the fluid from the liquid cooling system 123. The fluid can then flow to a front outlet manifold 111 towards the rear outlet disconnect 114 and the rack manifold 6. The front outlet manifold 111 can include at least one front outlet disconnect 300 extending from the front side 14 of the housing 12. The front outlet disconnects 300 can be fluidly coupled with the outlet cooling disconnects 220, 222 via corresponding one or more outlet conduits 150, 152. For example, as illustrated in FIGS. 2B and 2C, the left outlet cooling disconnect 220—in communication with the liquid cooling system 123 for the left module 109—can be fluidly coupled with a left outlet conduit 150 which is fluidly coupled with the left front outlet disconnect 301 of the front outlet manifold 111. The right outlet cooling disconnect 222—in communication with the liquid cooling system 123 for the right module 110—can be fluidly coupled with a right outlet conduit 152 which is fluidly coupled with the right front outlet disconnect 302 of the front outlet manifold 111.

In at least one example, the front inlet disconnects 200, inlet cooling disconnects 210, 212, outlet cooling disconnects 220, 222, and/or the front outlet disconnects 300 can include quick disconnects. The front inlet disconnects 200, inlet cooling disconnects 210, 212, outlet cooling disconnects 220, 222, and/or the front outlet disconnects 300 can be operable to automatically close upon disconnection of the front inlet disconnects 200, inlet cooling disconnects 210, 212, outlet cooling disconnects 220, 222, and/or the front outlet disconnects 300 with the inlet conduits 140, 142 and/or the outlet conduits 150, 152. For example, the front inlet disconnects 200, inlet cooling disconnects 210, 212, outlet cooling disconnects 220, 222, and/or the front outlet disconnects 300 can include valves such that when the front inlet disconnects 200, inlet cooling disconnects 210, 212, outlet cooling disconnects 220, 222, and/or the front outlet disconnects 300 are disconnected from the inlet conduits 140, 142 and/or the outlet conduits 150, 152, the corresponding valve(s) automatically close to prevent fluid from leaking in the computing system 10. Accordingly, the computing device 100 can be serviced with reduced amounts of fluid and/or no leaking fluid which can damage the computing system 10. Additionally, the computing components 3, 4 (e.g., in the left module 109 and the right module 110) can be manually serviced from the front side 14 of the housing 12 without the need of turning around or removing the computing device 100 from the rack 5.

As the front inlet disconnects 200, inlet cooling disconnects 210, 212, outlet cooling disconnects 220, 222, and the front outlet disconnects 300 are positioned external to the housing 12, no fluid connection is being made within the housing 12. Accordingly, any possible leaks would not lead to fluid leaking into the housing 12 and impacting the computing components 1, 2, 3, 4. Additionally, serviceability of the computing device 100 is improved since the computing device 100 can be disconnected easily with external connections 200, 210, 212, 220, 222, 300.

The fluid can be directed from the front outlet manifold 111 to the front-to-rear disconnect 114 via an outlet transmission tube 112. The outlet transmission tube 112 can be coupled with the outside surface of the housing 12. The outlet transmission tube 112 can be in fluid communication with the front-to-rear disconnect 114 and operable to direct the fluid from the front outlet manifold 111 to the front-to-rear disconnect 114. For example, the housing 12 can form an outlet groove 32 operable to receive the outlet transmission tube 112. The outlet transmission tube 112 is positioned external to the housing 12 of the computing device 100 such that the fluid remains outside of the housing 12 in case of leaks and for easy serviceability. By being received in the outlet groove 32, the footprint of the computing device 100 is not impacted or increased so that the computing device 100 can still be received in the rack 5 without needing any modification of rack 5 of the computing system 10. In at least one example, the outlet transmission tube 112 can be positioned along the right side 20 of the housing 12, opposite the inlet transmission tube 106.

Figure 4:
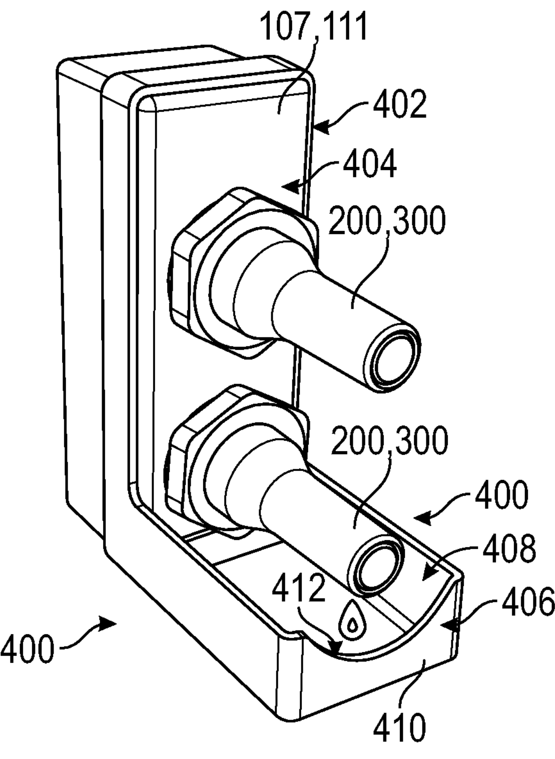
FIG. 4 illustrates a drip bib coupled with the front outlet manifold and/or the plurality of rear inlet disconnects.
Figure 5A:
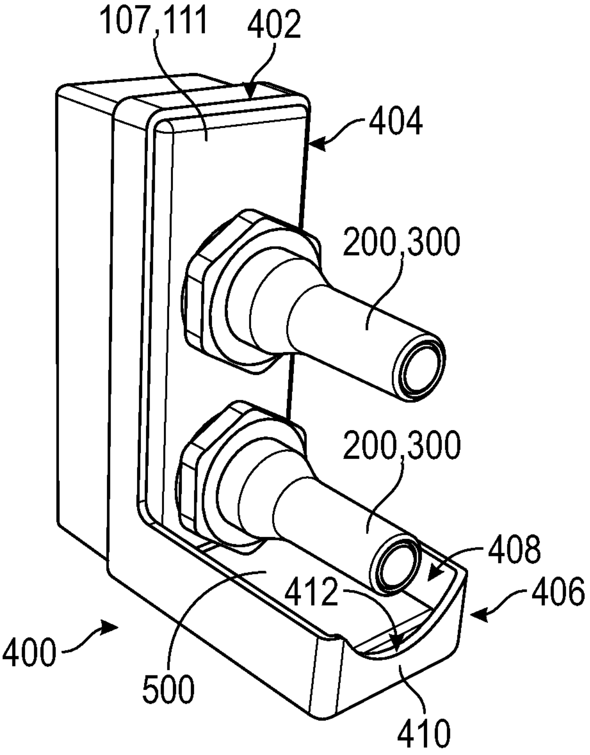
FIG. 5A illustrates the drip bib.
Figure 5B:
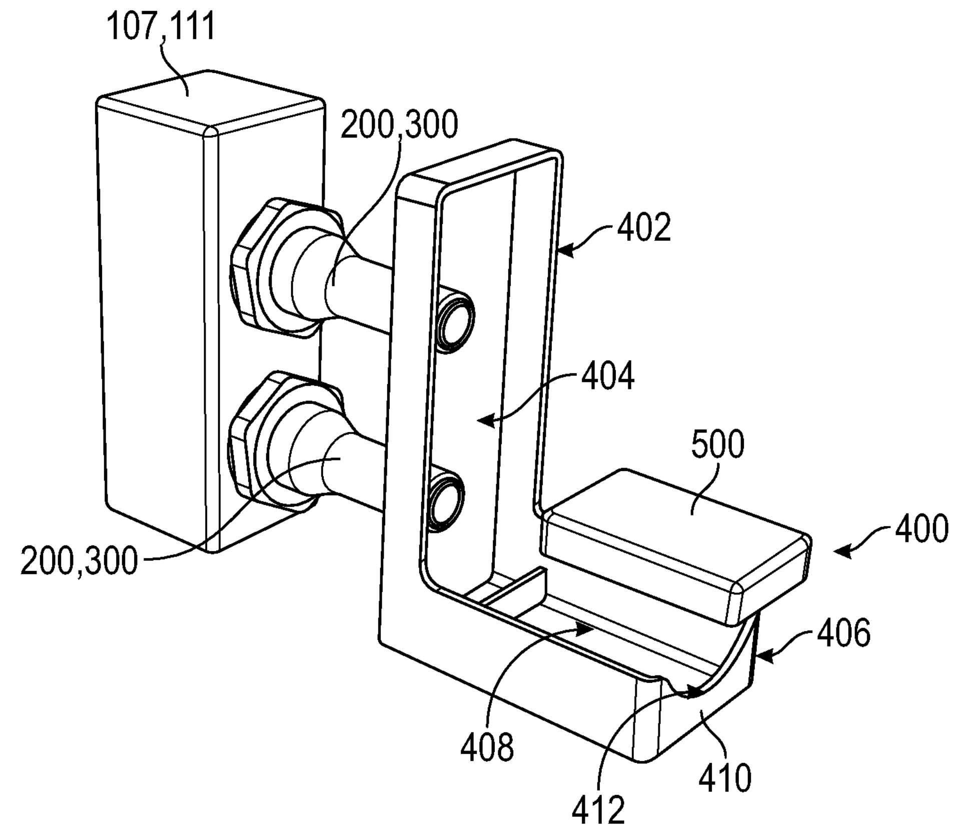
FIG. 5B illustrates an exploded view of the drip bib.

FIGS. 4-5B illustrate a drip bib 400 that is operable to catch and receive the fluid that leaks from the disconnects (e.g., front inlet disconnects 200 and front outlet disconnects 300). The drip bibs 400 can be operable to be coupled with the rear inlet disconnects 102, 104, front inlet manifold 107, front outlet manifold 111, and/or the rear outlet disconnects 114, 116 to catch the leaked fluid.

As illustrated in FIGS. 4-5B, the drip bib(s) 400 can include a coupler 402 operable to couple with the rear inlet disconnects 102, 104, front inlet manifold 107, front outlet manifold 111, and/or the rear outlet disconnects 114, 116. For example, the coupler 402 can form an aperture 404 that is operable to receive each of the rear inlet disconnects 102, 104, front inlet manifold 107, front outlet manifold 111, and/or the rear outlet disconnects 114, 116. The aperture 404 can be, for example, a rectangular shape. In some examples, the coupler 402 can utilize friction fit, adhesion, etc. to couple with the rear inlet disconnects 102, 104, front inlet manifold 107, front outlet manifold 111, and/or the rear outlet disconnects 114, 116. The coupler 402 can be configured to be retrofit to the computing device 100 such that no modification is needed to the computing device 100 to utilize the drip bib(s) 400.

Figure 6:
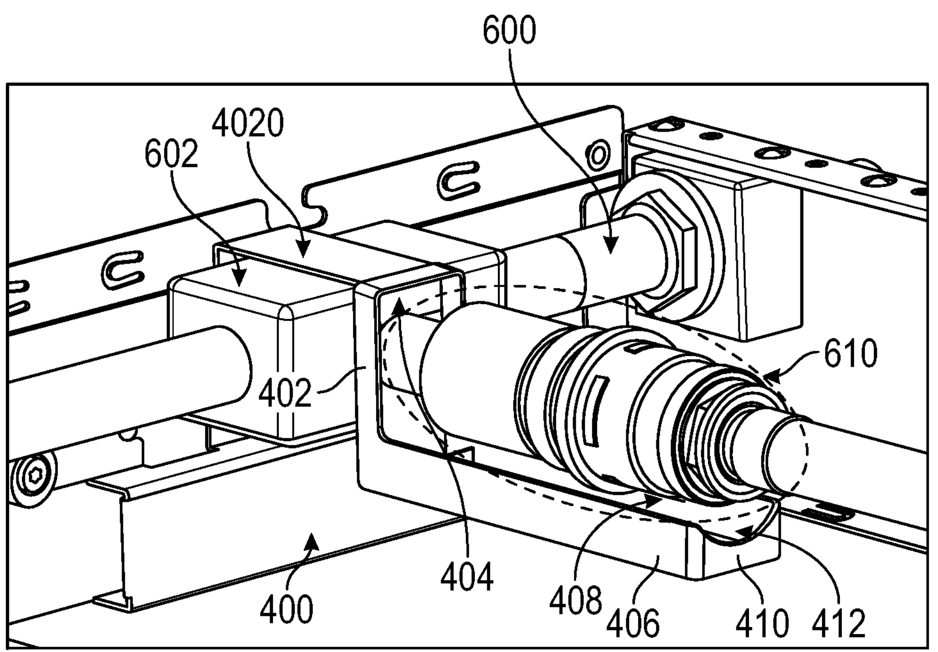
FIG. 6 illustrates the drip bib coupled with an internal manifold.

For example, FIG. 6 illustrates the drip bib coupled with an internal manifold 602. The internal manifold 602 may be operable to couple a plurality of internal conduits 600 that can permit fluid to flow therethrough. An internal disconnect 610 may extend from the internal manifold 602. To prevent leaking of fluid onto any computing components, a drip bib 400 can be installed on the internal manifold 602 to receive the internal disconnect 610. The coupler 402 of the drip bib 400 may include a hanger component 4020 that is operable to latch onto the internal manifold 602.

The drip bib 400 can include a tray 406 operable to receive the fluid that leaks from the rear inlet disconnects 102, 104, front inlet manifold 107, front outlet manifold 111, and/or the rear outlet disconnects 114, 116. The tray 406 can form a recess 408 that is operable to retain the leaked fluid without overflow. In at least one example, for example as illustrated in FIGS. 5A and 5B, the drip bib 400 can include a sponge 500 that is operable to be received in the tray 406. The sponge 500 can be operable to absorb the fluid received in the tray 406 to prevent overflow. For example, the sponge 500, upon contact with the fluid (e.g., PG25), can convert to gel and can be safer to handle than using a rag to clean up the leaked fluid in the tray 406.

In at least one example, the tray 406 can have a front surface 410 that includes an indentation 412. The indentation 412 can be formed to correspond with the shape and/or size of the disconnects. Accordingly, the drip bib 400 can be easily installed and/or removed without needing any modification to the computing device 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A computing device comprising:
- a housing including a front side and a rear side opposite the front side;
- a plurality of rear inlet disconnects extending from the rear side of the housing, the plurality of rear inlet disconnects operable to be fluidly coupled with a rack manifold and receive fluid from the rack manifold, the plurality of rear inlet disconnects including a rear-to-front disconnect and a rear-to-cooling disconnect;
- a front inlet manifold coupled with the housing, the front inlet manifold including at least one front inlet disconnect operable to be fluidly coupled with one or more inlet cooling disconnects extending from the front side of the housing via corresponding one or more inlet conduits, wherein the one or more inlet cooling disconnects are operable to be fluidly connected with a liquid cooling system; and
- an inlet transmission tube coupled with an outside surface of the housing, the inlet transmission tube in fluid communication with the rear-to-front disconnect and operable to direct the fluid from the rear-to-front disconnect to the front inlet manifold.

2. The computing device of claim 1, wherein the one or more inlet cooling disconnects are operable to be fluidly connected with the liquid cooling system received in the housing.

3. The computing device of claim 2, wherein the one or more inlet cooling disconnects are operable to be fluidly coupled with the liquid cooling system to lower a temperature of one or more peripheral component interconnect express cards.

4. The computing device of claim 1, wherein the rear-to-cooling disconnect is operable to be fluidly coupled with the liquid cooling system to lower a temperature of one or more processing units.

5. The computing device of claim 1, wherein the housing forms an inlet groove operable to receive the inlet transmission tube.

6. The computing device of claim 1, further comprising one or more drip bibs coupled with the plurality of rear inlet disconnects and/or the front inlet manifold, each of the one or more drip bibs including a tray operable to receive the fluid that leaks from the plurality of rear inlet disconnects and/or the front inlet manifold.

7. The computing device of claim 6, wherein the one or more drip bibs includes a sponge operable to be received in the tray, the sponge operable to absorb the fluid received in the tray.

8. The computing device of claim 1, further comprising:
- one or more outlet cooling disconnects fluidly coupled with the liquid cooling system received in the housing, the one or more outlet cooling disconnects operable to receive the fluid from the liquid cooling system; and
- a front outlet manifold including at least one front outlet disconnect extending from the front side of the housing, wherein the at least one front outlet disconnect is fluidly coupled with the one or more outlet cooling disconnects via corresponding one or more outlet conduits.

9. The computing device of claim 8, further comprising:
- a plurality of rear outlet disconnects extending from the rear side of the housing, the plurality of rear outlet disconnects operable to be fluidly coupled with the rack manifold and provide the fluid to the rack manifold, wherein the plurality of rear outlet disconnects includes a front-to-rear disconnect and a cooling-to-rear disconnect; and an outlet transmission tube coupled with the outside surface of the housing, the outlet transmission tube in fluid communication with the front-to-rear disconnect and operable to direct the fluid from the front outlet manifold to the front-to-rear disconnect.

10. The computing device of claim 9, wherein the cooling-to-rear disconnect is operable to receive the fluid from the liquid cooling system after the fluid lowers a temperature of one or more processing units positioned adjacent to the rear side of the housing.

11. The computing device of claim 9, further comprising one or more drip bibs coupled with the front outlet manifold and/or the plurality of rear outlet disconnects, each of the one or more drip bibs including a tray operable to receive the fluid that leaks from the front outlet manifold and/or the plurality of rear outlet disconnects.

12. The computing device of claim 11, wherein the one or more drip bibs includes a sponge operable to be received in the tray, the sponge operable to absorb the fluid received in the tray.

13. The computing device of claim 9, wherein the housing forms an outlet groove operable to receive the outlet transmission tube.

14. A computing system comprising:

a rack manifold; and a computing device fluidly coupled with the rack manifold, the computing device including:

a housing including a front side and a rear side opposite the front side;

a plurality of computing components;

a liquid cooling system received in the housing, the liquid cooling system operable to lower a temperature of the plurality of computing components;

a plurality of rear inlet disconnects extending from the rear side of the housing, the plurality of rear inlet disconnects operable to be fluidly coupled with the rack manifold and receive fluid from the rack manifold, the plurality of rear inlet disconnects including a rear-to-front disconnect and a rear-to-cooling disconnect;

a front inlet manifold coupled with the housing, the front inlet manifold including at least one front inlet disconnect operable to be fluidly coupled with one or more inlet cooling disconnects extending from the front side of the housing via corresponding one or more inlet conduits, wherein the one or more inlet cooling disconnects are operable to be fluidly connected with the liquid cooling system; and an inlet transmission tube coupled with an outside surface of the housing, the inlet transmission tube in fluid communication with the rear-to-front disconnect and operable to direct the fluid from the rear-to-front disconnect to the front inlet manifold.

15. The computing system of claim 14, wherein the plurality of computing components include: one or more processing units, and one or more peripheral component interconnect express (PCIE) cards.

16. The computing system of claim 15, wherein the one or more processing units are disposed in the housing adjacent to the rear side of the housing, and wherein the one or more PCIE cards are disposed in the housing adjacent to the front side of the housing.

17. The computing system of claim 16, wherein the one or more PCIE cards positioned adjacent to the front side of the housing are in fluid communication, via the liquid cooling system, with the one or more inlet cooling disconnects to lower the temperature of the one or more PCIE cards.

18. The computing system of claim 16, wherein the one or more processing units positioned adjacent to the rear side of the housing are in fluid communication, via the liquid cooling system, with the rear-to-cooling disconnect to lower the temperature of the one or more processing units.

19. A method comprising:

fluidly coupling a liquid cooling system of a computing device with a rack manifold via a plurality of rear inlet disconnects extending from a rear side of a housing of the computing device, wherein the plurality of rear inlet disconnects includes a rear-to-front disconnect and a rear-to-cooling disconnect;

directing a first flow of a fluid received by the rear-to-front disconnect from the rack manifold to a front inlet manifold coupled with a front side of the housing via an inlet transmission tube coupled with an outside surface of the housing; and directing the first flow of the fluid from the front inlet manifold to the liquid cooling system for one or more front computing components positioned adjacent to the front side of the housing through at least one front inlet disconnect fluidly coupled with one or more inlet cooling disconnects extending from the front side of the housing via corresponding one or more inlet conduits.

20. The method of claim 19, further comprising:

directing a second flow of the fluid received from the rack manifold by the rear-to-cooling disconnect to one or more rear computing components positioned adjacent to the rear side of the housing.

* * * * *